(12) United States Patent
Hoefer et al.

(10) Patent No.: US 10,656,230 B2
(45) Date of Patent: May 19, 2020

(54) EPR RESONATOR WITH EXTENDED TRANSPARENCY AND HOMOGENEITY IN RF RANGE

(71) Applicant: Bruker BioSpin GmbH, Rheinstetten (DE)

(72) Inventors: Peter Hoefer, Ettlingen (DE); Ion Prisecaru, Karlsruhe (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 203 days.

(21) Appl. No.: 15/850,259

(22) Filed: Dec. 21, 2017

(65) Prior Publication Data
US 2018/0172790 A1    Jun. 21, 2018

(30) Foreign Application Priority Data
Dec. 21, 2016  (EP) ................................ 16205779

(51) Int. Cl.
*G01R 33/565*    (2006.01)
*G01R 33/60*    (2006.01)
(Continued)

(52) U.S. Cl.
CPC ..... *G01R 33/56518* (2013.01); *G01R 33/345* (2013.01); *G01R 33/60* (2013.01); *H01P 7/005* (2013.01); *H01P 7/06* (2013.01)

(58) Field of Classification Search
CPC .............. G01R 33/56518; G01R 33/60; G01R 33/345; G01R 33/34; H01P 7/005; H01P 7/06
See application file for complete search history.

(56) References Cited

U.S. PATENT DOCUMENTS

| 3,250,985 A | 5/1966 | Hyde et al. |
| 4,791,392 A * | 12/1988 | Brunner ............... G01R 33/343 324/316 |

(Continued)

FOREIGN PATENT DOCUMENTS

| CN | 101940904 A | 1/2011 |
| CN | 102657559 A | 9/2012 |

(Continued)

OTHER PUBLICATIONS

Reijerse et al., "A tunable general purpose Q-band resonator for CW and pulse EPR/ENDOR experiments with large sample access and optical excitation", Journal of Magnetic Resonance, Vo. 214, Nov. 30, 2011, pp. 237-243.

*Primary Examiner* — Akm Zakaria
(74) *Attorney, Agent, or Firm* — Edell, Shapiro & Finnan, LLC

(57) ABSTRACT

An EPR resonator for a cylindrical TE01n microwave mode, where n=1, 2, 3, or 4, has: a cylindrical body (10) which has an RF absorption of less than 5% at RFs below 1 kHz, a first plunger (11) delimiting the resonating volume within the body in an axial direction at a first end and a second plunger (12) delimiting the resonating volume within the body at a second end, the second plunger having an opening (13) for inserting an EPR sample. The first and second plunger each has a spiral winding of an electrically conductive filament wherein neither the ends nor neighboring turns of the spiral windings have electrically conductive connections prone to forming electrically closed loops. Using spiral winding plungers for cylindrical TE01n microwave modes provides equivalent functionality compared to conventional plungers, but without creating Eddy currents at frequencies lower than the frequency of the TE01n microwave mode.

19 Claims, 10 Drawing Sheets

(51) Int. Cl.
*H01P 7/06* (2006.01)
*G01R 33/345* (2006.01)
*H01P 7/00* (2006.01)

(56) References Cited

U.S. PATENT DOCUMENTS

| | | | |
|---|---|---|---|
| 5,212,449 A | 5/1993 | Gentsch et al. | |
| 5,345,203 A | 9/1994 | Gentsch et al. | |
| 5,661,445 A * | 8/1997 | Larson, III | G01R 33/385 |
| | | | 324/318 |
| 5,986,526 A * | 11/1999 | Kopal | H01P 7/06 |
| | | | 333/209 |
| 8,128,788 B2 | 3/2012 | Proudkii et al. | |
| 10,105,695 B2 * | 10/2018 | Boulet | B01J 20/3007 |
| 10,353,027 B2 | 7/2019 | Prisecaru et al. | |
| 2014/0021952 A1 * | 1/2014 | Tkach | G01R 33/345 |
| | | | 324/316 |
| 2015/0185255 A1 * | 7/2015 | Eaton | G01R 33/60 |
| | | | 324/316 |
| 2015/0185299 A1 * | 7/2015 | Rinard | G01R 33/34046 |
| | | | 324/322 |
| 2016/0274200 A1 | 9/2016 | Prisecaru et al. | |

FOREIGN PATENT DOCUMENTS

| | | |
|---|---|---|
| CN | 105990631 A | 10/2016 |
| DE | 4125655 C2 | 2/1993 |
| GB | 966919 A | 8/1964 |
| JP | S51-007390 A | 1/1976 |
| JP | S61-284650 A | 12/1986 |
| JP | S63-042456 A | 2/1988 |
| JP | H11-511987 A | 2/1999 |
| JP | 2016-176932 A | 10/2016 |
| WO | 9707412 A1 | 2/1997 |
| WO | 03010849 A1 | 2/2003 |

* cited by examiner

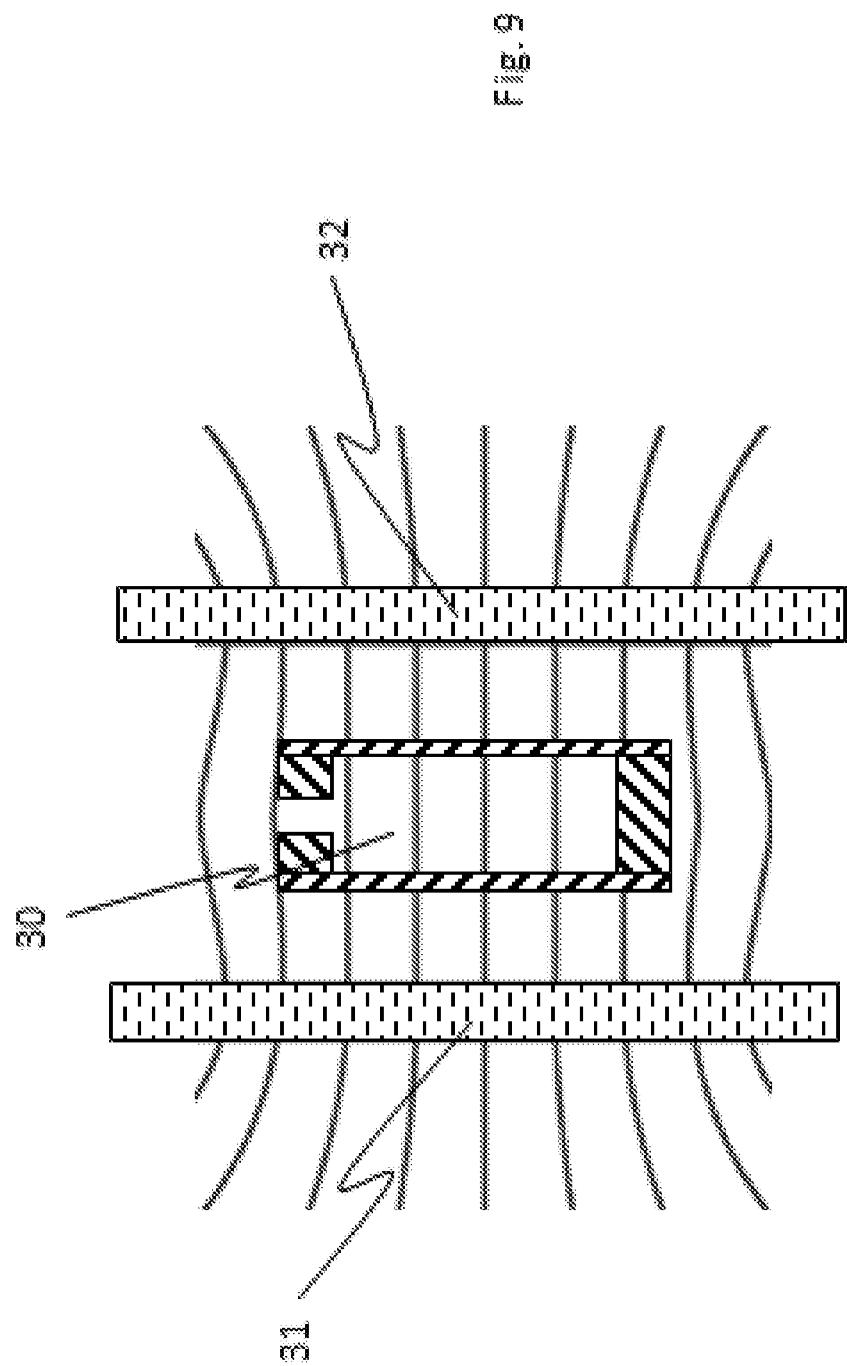

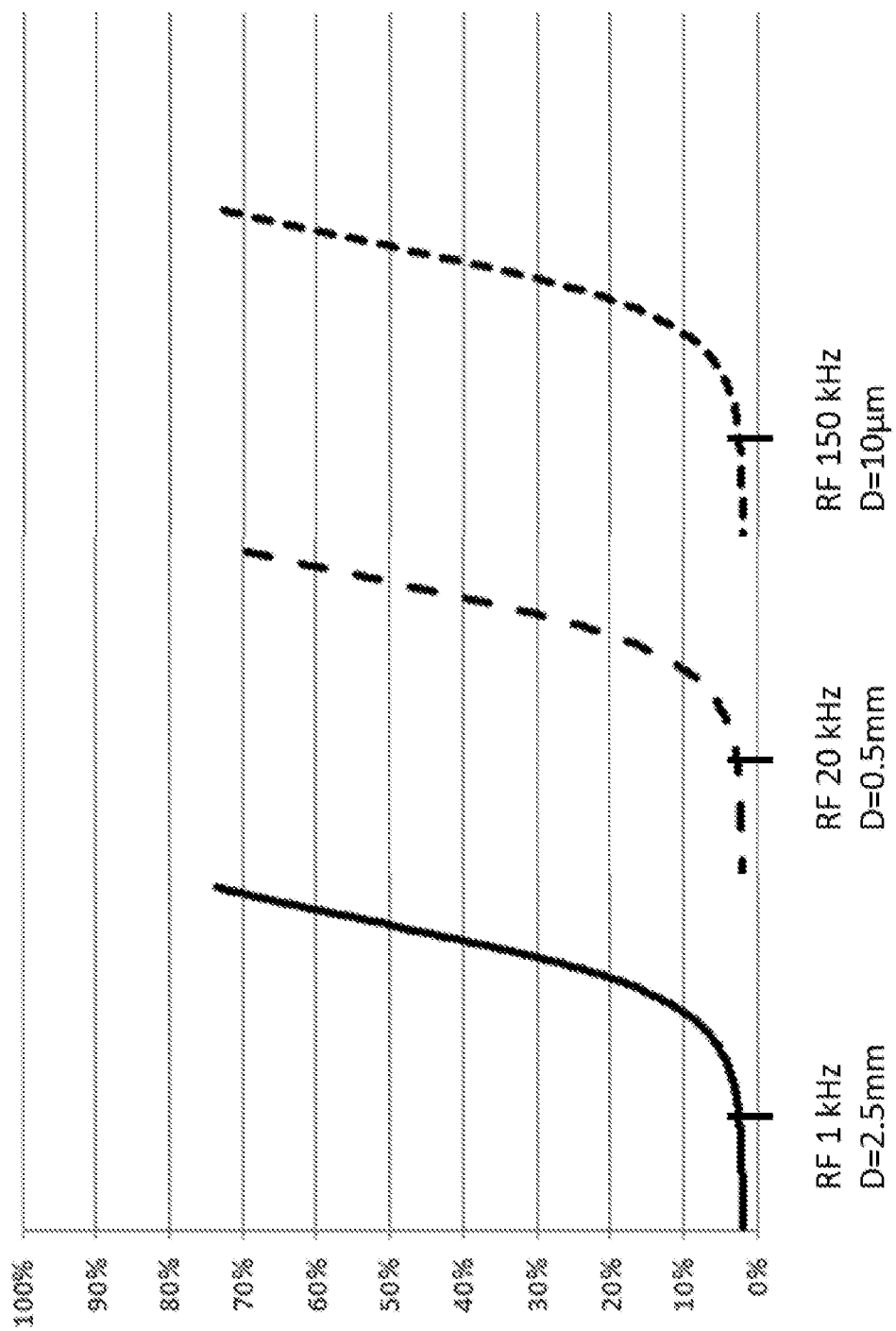

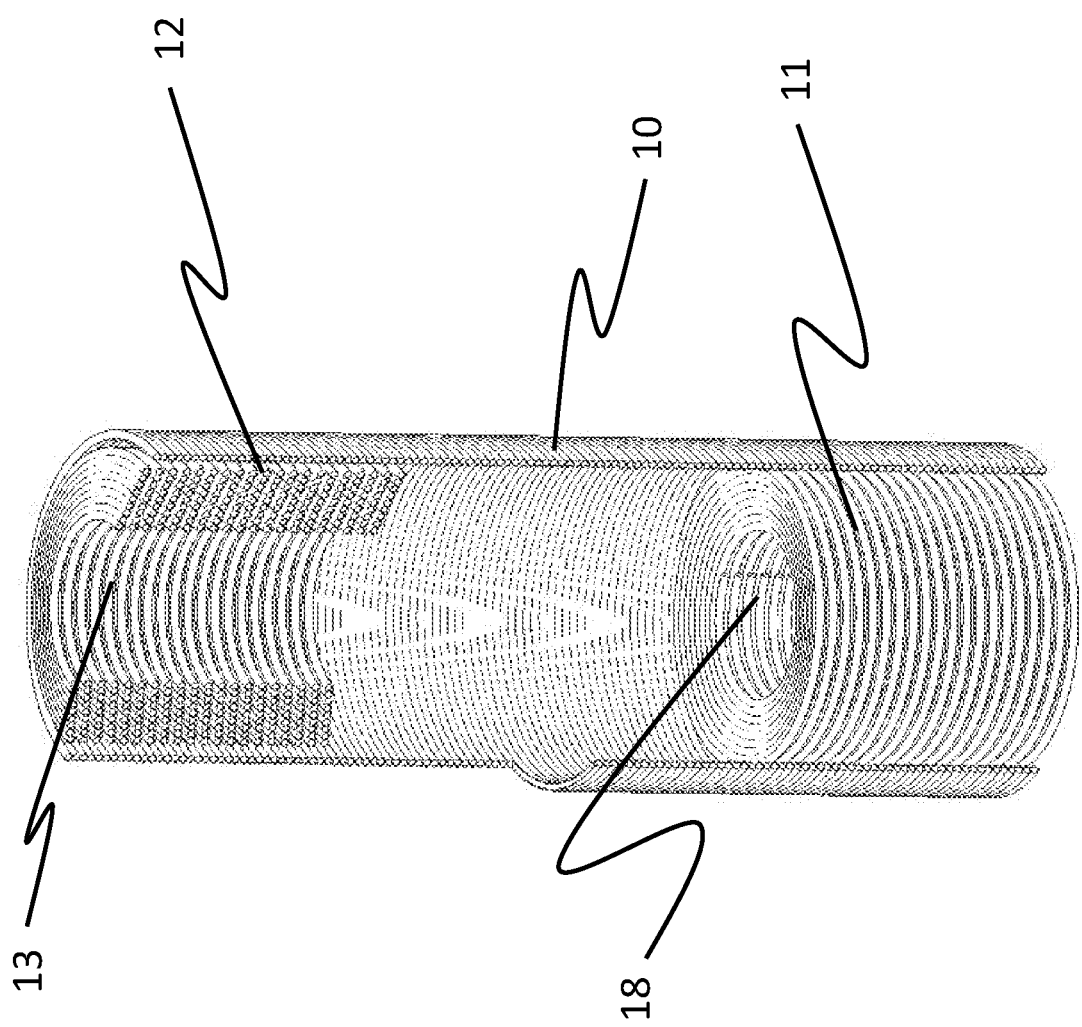

EPR RESONATOR WITH EXTENDED TRANSPARENCY AND HOMOGENEITY IN RF RANGE

CROSS REFERENCE TO RELATED APPLICATIONS

The following disclosure is based on and claims the benefit of and priority under 35 U.S.C. § 119(a) to European Patent Application No. 16205779.8, filed Dec. 21, 2016, and the disclosure of which is incorporated in its entirety into the present application by reference.

FIELD OF THE INVENTION

The present invention relates to an EPR (="electron paramagnetic resonance") resonator for a cylindrical TE01n microwave mode where n is an integer, in particular an integer from 1 to 4.

BACKGROUND

Such an EPR resonator ordinarily includes:
a cylindrical body which has an RF absorption of less than 5% at RFs below 1 kHz,
a first plunger delimiting the resonating volume within the cylindrical body in an axial direction at a first end and
a second plunger delimiting the resonating volume within the cylindrical body in an axial direction at a second end, the second plunger having an opening for inserting an EPR sample into the EPR resonator.

A device of this type is known from U.S. Pat. No. 5,345,203 and from DE 41 25 655 C2.

Standard CW and Rapid Scan EPR spectroscopy methods, either of high or medium or low sensitivity type of implementations, require a simultaneous application of static, RF and microwave magnetic fields upon the material (i.e. the EPR sample) under study contained within a microwave cavity. Sensitivity in EPR spectroscopy is reflected by the signal to noise ratio of a measured EPR spectrum.

A microwave field, with frequency above 1 GHz, is called "internal" when its resonant energy is confined within the transmission line and the metallic walls of a microwave cavity, using one of its resonance modes. With respect to the EPR resonator design and technology the degree of this confinement draws its own borders between high sensitivity, medium or low sensitivity implementations.

To qualify for high sensitivity CW EPR applications (i.e. obtaining maximum EPR signal amplitude for a given unit of supplied microwave power) a microwave resonator may be designed for an optimum volume of an EPR sample (i.e. not too low sample volume—leading to low sensitivity by decreasing the number of EPR spins—and not too high sample volume—leading to medium or low sensitivity by decreasing the EPR signal through a reduced Q-factor of the EPR cavity). Furthermore the microwave cavity should have less than 40 dB loss of its resonant energy through various leakage mechanisms to the exterior of the cavity.

The RF field, with frequencies from kHz to MHz, is called "external" when it is generated by coils placed outside of the microwave cavity and when its energy is neither resonant to nor confined in the microwave cavity. Ideally the metallic walls of the microwave cavity should not interact with the external RF field. Unfortunately such interactions exist in the form of RF Eddy currents which directly influence several parameters of the external RF field across the EPR sample: amplitude (also known as the RF "transparency"), phase and homogeneity.

Furthermore, yet equally important for high-sensitivity EPR spectroscopy, the RF Eddy currents in the metallic walls of the EPR microwave cavity will produce also secondary effects, like Joule heating and vibrations of the microwave cavity, the latter caused by interactions between RF Eddy currents and the static magnetic field.

All these effects caused by presence of RF Eddy currents produce negative effects on the spectroscopic data of an EPR experiment.

The state-of-the-art simply relies on a local RF transparency for the cavity walls in nearest proximity to the EPR sample, while the entire issue of RF field homogeneity at the EPR sample location has not been seriously considered yet.

To date EPR microwave cavities for high-sensitivity applications consist of an assembly of sub-components, that are often electrically interconnected. These sub-components define a resonator volume surrounded by metallic walls, designed to be almost untransparent for the resonant microwave field. By selecting a specific microwave resonant mode with cylindrical symmetry (TE01n, where n is an integer and is chosen between 1 to 3) a high-sensitivity resonator can be designed with sub-components having cylindrical shapes: one cylindrical body called "body" (that defines the radius of cylindrical cavity) which is delimited at its axial ends by two plungers. Thereby the interior space between the plungers defines the cavity length. At least one plunger has an opening for bringing the sample or other EPR specific tools (e.g. dewars, sample holder) into the resonator volume.

Prior art high-sensitivity cylindrical CW EPR cavities propose two engineering solutions for the problem of RF Eddy currents:

a) the cylindrical body of the resonator is made of a wire wound conductive structure that is coated with a dielectric, where windings extend axially to form a solenoid, and b) the cylindrical body of the resonator is made of a dielectric which is used as support for one or more thin metallization layers, sometimes accompanied by a slotting of the metallization layer.

In the above solutions only modifications of the EPR cavity body are addressed. Plungers delimiting the cavity at its axial ends usually are made of solid metal or of metallized dielectric (without any slotting). Prior art plungers, at least for cylindrical TE01n microwave resonance modes, are not optimized for the suppression of RF Eddy currents. Moreover low loss full metal transmission lines (waveguides or coaxial cables) that connect the EPR cavity to the microwave bridge, being placed sidewise to the cavity body may contribute to RF Eddy currents.

In conclusion prior art solutions succeed only to partially and locally mitigate the formation of RF Eddy currents, specifically in the cavity body walls. It is known that this partial approach might work well for obtaining sufficient RF transparency of the EPR cavity, at least around the region of interest (i.e. the EPR sample volume as placed in the center of cavity), as long as RF homogeneity, thermal loading of cavity and the mechanical oscillations are not an issue. Prior art solutions are not sufficient if e.g. the source of the external RF field has similar or bigger size compared to the EPR cavity as required for bigger EPR samples and, if RF field homogeneity in the bigger EPR sample volume has to be kept. In addition the power of the RF field and microwave field is increased for high sensitivity EPR. Therefore the thermal loading of the cavity and/or the oscillations produced by interaction of RF Eddy currents with the strong static magnetic field become important parameters.

U.S. Pat. No. 5,345,203 and DE 41 25 655 C2, cited above, disclose a "Resonator arrangement for electron spin resonator spectroscopy"—contains cylindrical TE012 EPR resonator that has body with wire wound (solenoid) design. Here, as mentioned above:

a) the two axial plungers—top and bottom—used for closing the microwave TE012 cylindrical cavity and for defining its axial length, are made of solid metal.

b) the antenna used for microwave coupling is placed sideways and perpendicular to the resonator axis, therefore a hole in the wire wound solenoid body is needed. Further, the coaxial cable is soldered in this hole, forming, as side effect, an electrical connection between a couple of solenoid turns in the EPR cavity wall. This microwave coupling arrangement forces some winding turns of the solenoid body (cavity wall) to become electrically closed and therefore prone to develop RF eddy currents. In this configuration the electrical connection of the shield of the coaxial cable with the EPR cavity body creates closed loops and thereby significant contribution to RF Eddy currents as well.

In particular, U.S. Pat. No. 5,345,203 and DE 41 25 655 C2 show in FIG. 6 a cylindrical wire wound body, a first plunger and a second plunger, both of which are made entirely of metal. As the plungers are made of metal they are not RF transparent. As the body is wire wound an external RF field is capable of traversing the EPR sample volume, locally in the center of microwave cavity.

SUMMARY

The present application describes a way to substantially overcome one or more disadvantages and trade-offs of the above discussed existing methods and devices.

One major object of the present invention is to propose a high sensitivity EPR resonator concept, which mitigates RF Eddy current effects on RF field homogeneity, thermal loading of cavity or RF-frequency oscillations in these microwave resonators. Compared to state of the art EPR resonators, it is desired —especially for Rapid Scan EPR experiments—to have a global RF transparency, an improvement of RF homogeneity, heating and vibrations caused by RF Eddy currents. Therefore one problem to be solved is mitigating the formation of almost all RF Eddy currents, i.e. not only those induced in all metal wall surfaces of the cavity and of the microwave transmission line, but also those induced in any kind of RF loops.

Another object of the present invention is to propose an EPR resonator with an optimal combination between the microwave resonance mode (cylindrical TE01n mode, n being an integer from 1 to 4) and the suitable wire wound technology for all components of a microwave cavity in order to reduce its electromagnetic interaction with the external RF-field.

According to one aspect of the present invention, these objects are achieved by modifying the device discussed above in that the first and the second plunger each comprise a spiral winding of an electrically conductive filament wherein neither the ends nor neighboring turns of the spiral windings have electrically conductive connections which could lead to a formation of electrically closed loops.

A major advantage of a spiral winding plunger as described by the present invention is that for cylindrical TE01n microwave modes it provides equivalent functionality compared to state of the art plungers, but without creating Eddy currents at frequencies lower than the frequency of the TE01n microwave mode.

In preferred embodiments of the present invention, the ratio $D/\delta$ of the minimum extension D of the filament to the distance $\delta$ between neighboring turns of the spiral winding is bigger than 1:1, in particular bigger than 3:1, preferably bigger than 10:1. The specified ratios reduce the leakage of microwave field through the volume of the plungers as claimed.

In a further embodiment of the invention, the ratio of a plunger's axial length to its inner bore diameter is equal or bigger than 1, in particular bigger than 3.

The specified values reduce the leakage of microwave field through the bores of the claimed plungers while keeping an access required for bringing the sample and further inserts into the EPR resonator volume.

In another embodiment of the invention, the first plunger and/or the second plunger comprise at least two layers, in particular about 30 layers, of electrically conductive spiral filament arranged in the axial direction without electrically conductive connection between neighboring layers. The use of multiple layers further reduces the leakage of microwave field.

In still another embodiment of the invention, the opening of the second plunger has a size smaller than the cut-off diameter for the cylindrical TE01n mode. By choosing the plunger opening to be smaller than the cut-off diameter the leakage of microwave field is reduced.

In a further embodiment of the invention, the first plunger has an opening for a support of the sample in its working position. The sample can be mechanically stabilized and adjusted within the resonator in this manner.

In another embodiment of the invention, the first plunger or the second plunger has a second opening for transmitting the microwave radiation via an antenna. Co-axial lines can thereby be used for microwave radiation transmission, passing through plungers without creation of electrically closed loops. RF Eddy currents are minimized to the contribution from transmission line and antenna alone.

In a class of embodiments of the invention, the space between neighboring turns of the filament is filled with an insulator. Via the insulator, the mechanical stability of the plunger is improved and electric conductance is avoided A further class of embodiments of the invention is characterized in that the filament is coated with an insulator. Through filament insulation coatings, the quality of electrical insulation for microwave and EPR purposes is improved.

In further preferred embodiments of the EPR resonator according to the invention, the extension D of a filament is in the range of 5 µm to 5 mm, in particular 30 µm to 1 mm. By selection of the extension D the microwave opacity and RF transparencies of the filament can be optimized.

In practical applications of the invention, the filament will comprise a fully metal wire, preferably Ag or Au coated copper, brass or tungsten, or Ag or Au wire. By using a fully metal wire, the properties pertaining to Eddy currents of the filaments are homogeneously distributed along the length of wire wound structure, while Ag or Au metallic coatings provide less EPR background signals.

Further favorable embodiments are characterized in that an RF field is generated by RF coils arranged outside the EPR resonator and that the lateral dimension of the RF coils relative to the axial length of the resonating volume within the cylindrical body is in the range of 50% to 200%, preferably about 100%. This setup provides a larger homogeneous RF field volume in the resonator and therefore a higher sensitivity.

For most implementations of the EPR resonator according to the present invention, the homogeneity of the RF field at the sample volume is in the range from 0.01% to 10%, in particular 0.1% to 1%. By the selected homogeneities the resolution of the setup is further optimized.

BRIEF DESCRIPTION OF THE DRAWINGS

These, as well as other objects and advantages of this invention, can be better understood and appreciated through careful study of the following detailed description of presently preferred and exemplary embodiments of this invention in conjunction with the accompanying drawing.

In order to make the aforesaid and other features and advantages of the present invention more apparent to those skilled in the art, preferred embodiments of the present invention will be described in detail below by referring to the accompanying drawings, wherein identical numerals represent the same parts.

FIG. 9 shows a further embodiment of the EPR resonator according to the invention surrounded by RF coils generating a magnetic field covering the whole EPR resonator;

FIG. 12 shows the characteristic curves of additional RF power absorption computed as relative to a constant amount of RF power delivered to the RF coils effected by EPR cavity for different extensions D of the filaments; and FIG. 13 shows in a cut open depiction the fully RF-transparent TE01n EPR resonator according to the invention as composed of three parts: one wire wound solenoid (body) and two wire spiral wound (plungers) with openings placed inside the solenoid at its ends.

DETAILED DESCRIPTION

Figure 2:
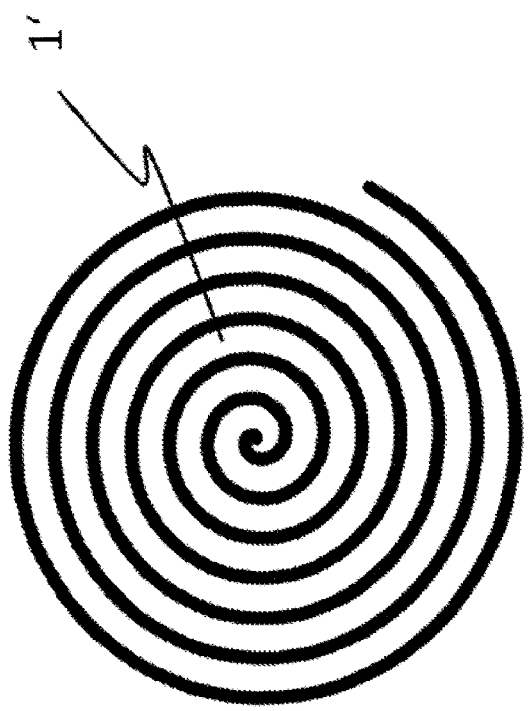
FIG. 2 shows another embodiment without an opening in the center.

The state-of-the-art simply accepts a local RF transparency for the cavity walls in nearest proximity to the EPR sample, while the entire issue of RF field homogeneity at the EPR sample location has not been seriously considered yet. Hence compared to prior art EPR resonators, it is desired—especially for Rapid Scan EPR experiments—to have a global RF transparency, an improvement of RF homogeneity, also less heating and vibrations caused by RF Eddy currents. Therefore one object addressed by the present invention is the mitigation of almost all RF Eddy currents in the cavity, i.e. not only those induced in all metal wall surfaces of the cavity and of the microwave transmission line but also those induced in any kind of RF loops.

Embodiments of the present invention therefore result in an EPR resonator concept with an optimal combination between the microwave resonance mode (i.e. the cylindrical TE01n mode, where n is an integer between 1 and 4) and a suitable wire wound technology for each component of a microwave cavity in order to reduce its electromagnetic interaction with the external RF-field. In the following, the invention is further explained and discussed in detail by way of examples:

All embodiments of the EPR resonator according to the invention as well as the generic devices according to the closest prior art are designed for use in a cylindrical TE01n mode, where n is an integer, in particular an integer from 1 to 4. Each of these EPR resonators comprises a cylindrical body 10 which has a RF absorption of less than 5% at RFs below 1 kHz,
a first plunger 11 delimiting the resonating volume within the cylindrical body 10 in an axial direction at a first end and a second plunger 12 delimiting the resonating volume within the cylindrical body 10 in an axial direction at a second end, the second plunger 12 having an opening 2, 13 for inserting an EPR sample 14 into the EPR resonator.

The EPR resonator according to the invention is characterized in that the first and the second plunger 11, 12 each comprise a spiral winding 1, 1' of an electrically conductive filament 3, 3' wherein neither the ends nor neighboring turns of the spiral windings 1, 1' have electrically conductive connections which could lead to a formation of electrically closed loops.

The first plunger 11 and/or the second plunger 12 comprise at least two layers, in particular about 30 layers, of electrically conductive spiral filament 3, 3' arranged in the axial direction without electrically conductive connection between neighboring layers.

The opening 2, 13 of the second plunger 12 should have a size smaller than the cut-off diameter of the cylindrical TE01n mode.

The space between neighboring turns of the filament can be filled with an insulator. Further, the filament 3, 3' can be coated with an insulator. The filament 3, 3' will usually comprise a full metal wire, preferably Ag or Au coated copper, brass or tungsten, or Ag or Au wire.

In most practical implementations of the present invention, an RF field is generated by RF coils arranged outside the EPR resonator and the lateral dimension of the RF coils relative to the axial length of the resonating volume within the cylindrical body 10 is in the range of 50% to 200%, preferably about 100%.

The homogeneity of the RF field at the sample volume will be in the range from 0.01% to 10%, in particular 0.1% to 1%.

Figure 1:
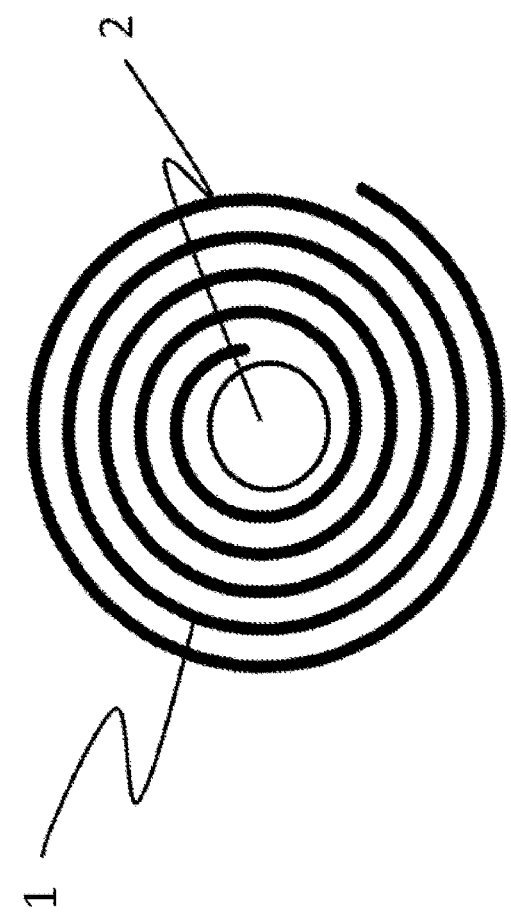
FIG. 1 schematically shows an embodiment of the spiral winding structure of the electrically conductive filament in the first and second plungers having an opening in the center.

FIGS. 1 and 2 show the structures of the first and second plunger with an opening 2 (FIG. 1) and without (FIG. 2). The plungers comprise a spiral winding 1; 1' of an electrically conductive filament 3; 3'. The turns of the spiral filaments do not contact each other electrically, neither at the ends of the filament nor in neighbouring turns.

Figure 3B:
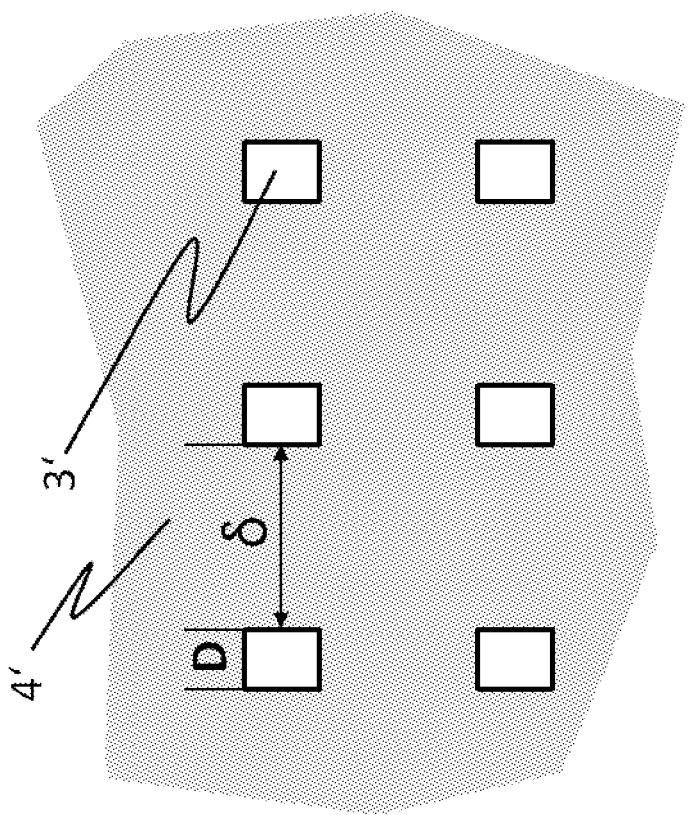
FIG. 3B shows two layers of spiral windings of electrically conductive filament having a squared cross section.
Figure 3A:
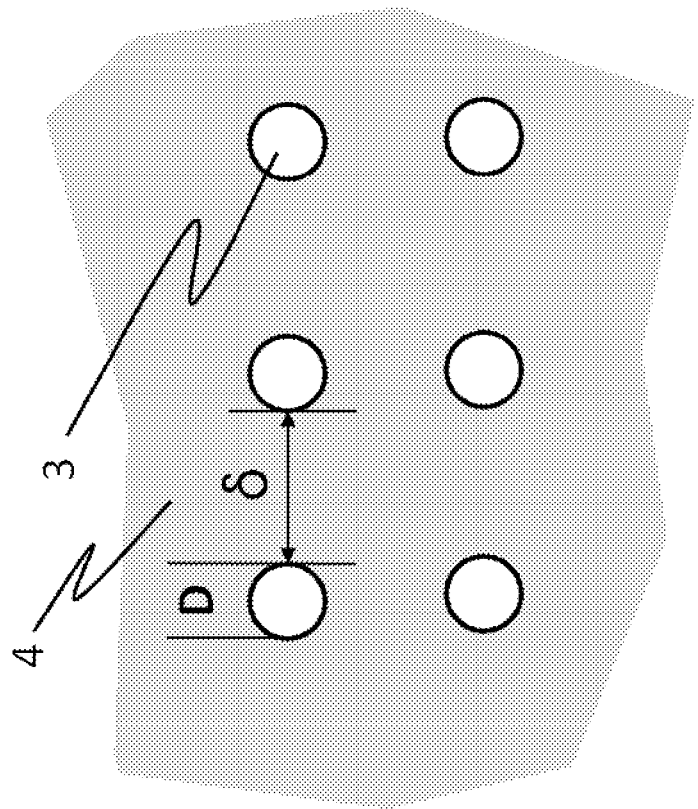
FIG. 3A shows two layers of spiral windings of electrically conductive filament having a circular cross section.

FIGS. 3A and 3B show two layers of spiral windings of filaments 3, 3' in a cross section. The spacing between neighboring parts of a winding is denoted as δ, the extension of the filament in the same direction is denoted as D. As a general rule, D/δ should be in the range of 3 to 10 to achieve the desired microwave intransparency (same for the ratio of holes in of diameter plungers vs. their axial length). This rule can be derived from assuming evanescent propagation (damping) of the magnetic field in the dielectric material (air included) between filaments. The filament extension D can be used to adapt the EPR resonator to different cutoff RF absorption frequencies as shown below in FIG. 12. The distance D between filaments in different layers should be at least as big as δ/2.

The filaments are electrically isolated and mechanically stabilized by insulator 4, 4'. An electrically insulating coating on the filaments itself improves the insulation further and reduces risks of accidental electrical contact between the windings of the filament.

Figure 5:
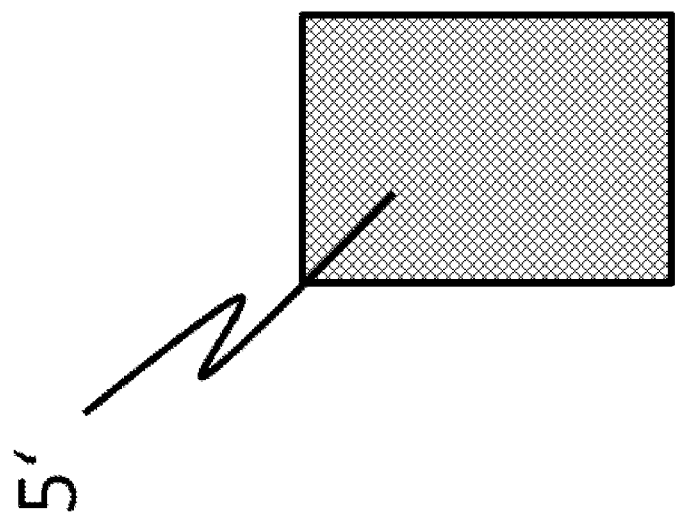
FIG. 5 shows a cross section of an embodiment of a an electrically conductive filament made entirely of metal and having a squared cross section.
Figure 4:
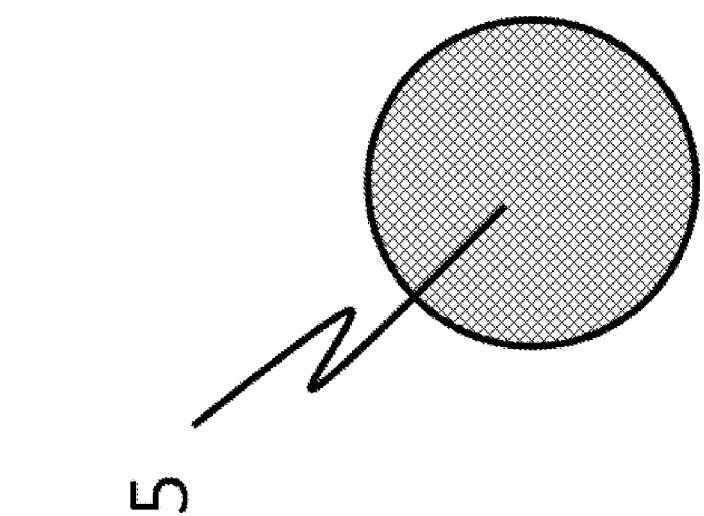
FIG. 4 shows a cross section of an embodiment of an electrically conductive filament made entirely of metal and having a circular cross section.

FIGS. 4 and 5 show different structures of the filaments used. In particular, FIGS. 4 and 5 show a filament 5; 5' consisting entirely of metal.

Figure 6:
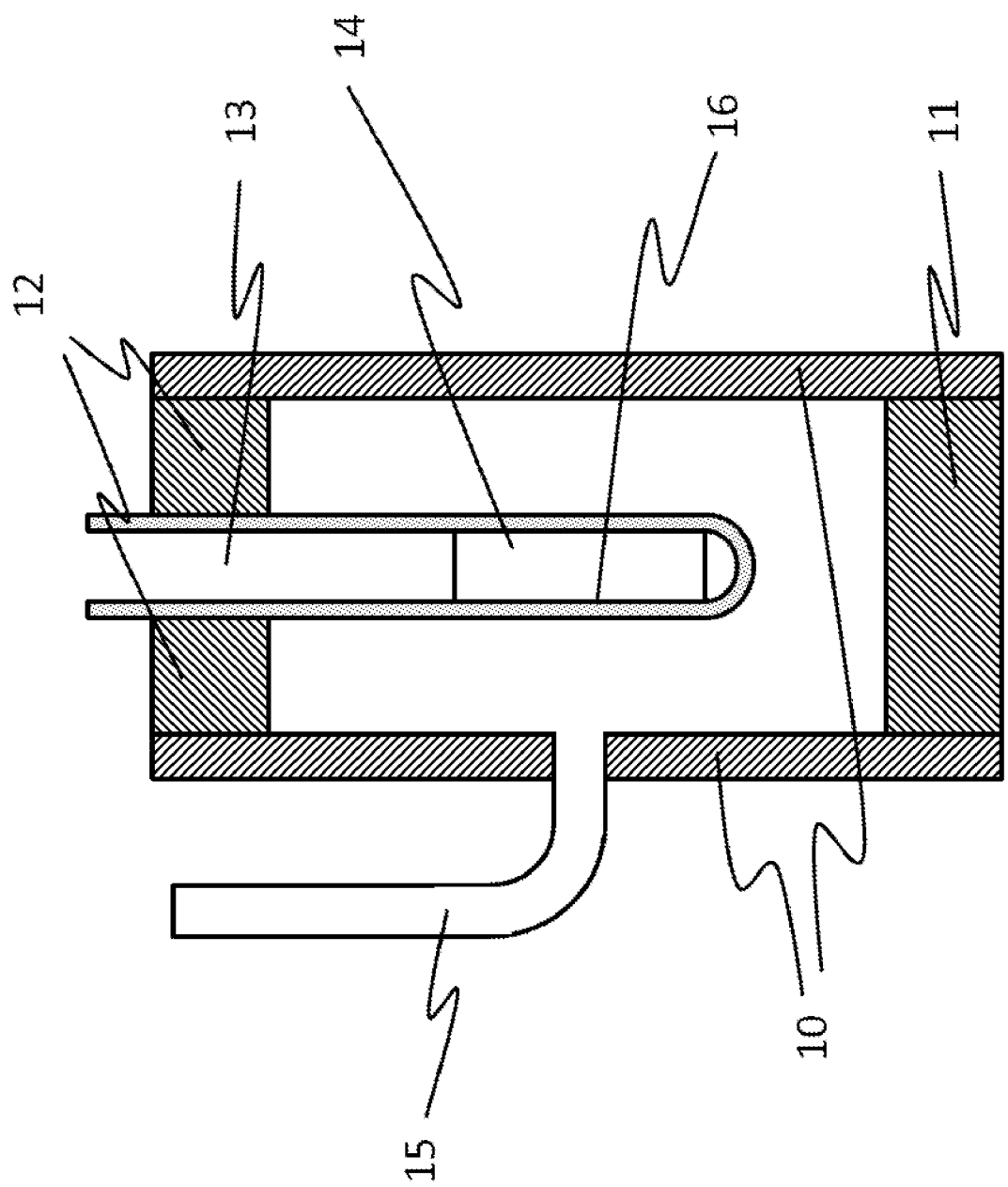
FIG. 6 schematically shows a cross sectional view of a first embodiment of the EPR resonator according to the invention.

FIG. 6 shows a first embodiment of an EPR resonator according to the invention. The cylindrical body 10 is delimited by the first plunger 11 and the second plunger 12, which has an opening 13. The opening allows to insert a sample 14 into the resonator. A dielectric sample tube 16 holds the sample 14 in its working position. The tube 16 can be inserted and taken out of the resonator together with the sample 14. A coaxial line terminated with a radiative element 15 (loop or antenna) allows microwaves to enter the resonator.

The first plunger 11 can have an opening 18 for a support 17 of the sample 14 in its working position. In further embodiments of the invention, the first plunger 11 or the second plunger 12 may have a second opening 18' for transmitting the microwave radiation via an antenna 19.

Figure 7:
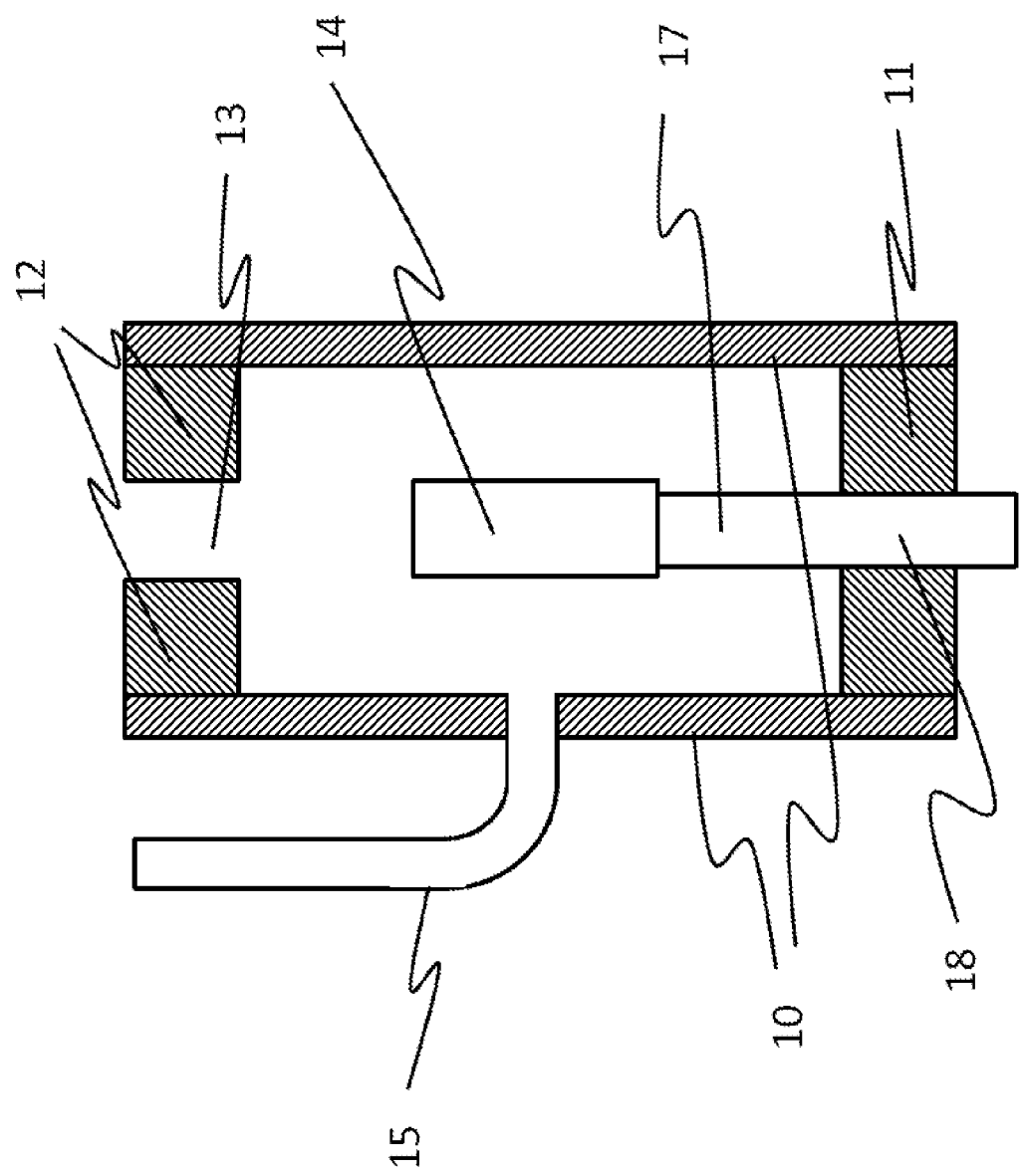
FIG. 7 shows a second embodiment of the EPR resonator according to the invention.

FIG. 7 shows a second embodiment of an EPR resonator according to the invention. Different to FIG. 6 the first plunger 11 has an opening 18 too. In this case the sample 14 is supported by a dielectric sample holder 17 that traverses the first plunger 11.

Figure 8:
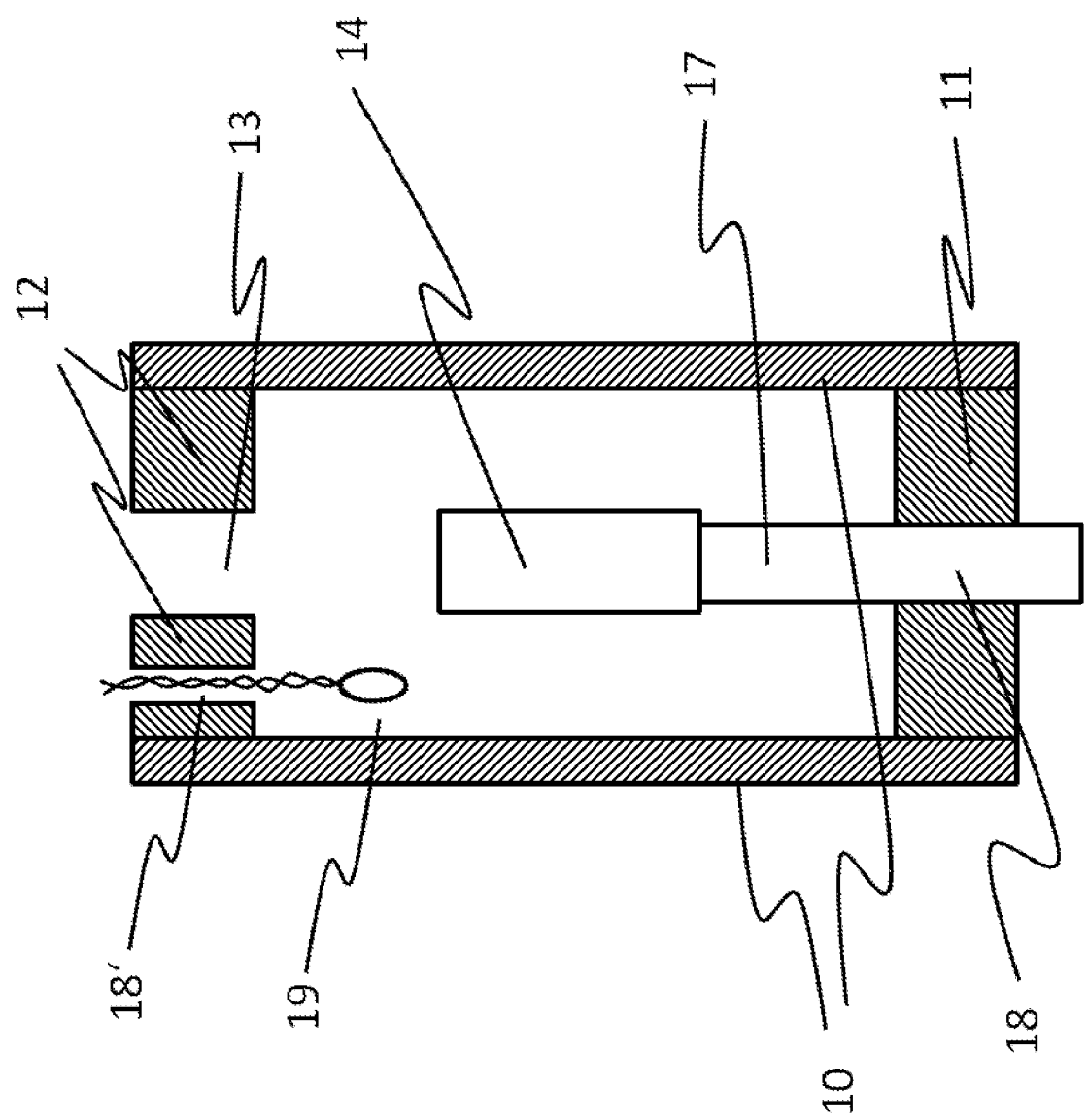
FIG. 8 shows a third embodiment of the EPR resonator according to the invention.

FIG. 8 shows a third embodiment of an EPR resonator according to the invention. Microwaves now are coupled through a second opening 18' of the second plunger 12 into the resonator by an antenna 19. As an alternative microwaves may be coupled into the resonator through the openings 13 and 18 too.

FIG. 9 shows an EPR resonator 30 surrounded by RF coils 31, 32 which are e.g. 150% bigger than the axial extension of the EPR resonator. The RF coils generate a magnetic field covering the whole EPR resonator.

Figure 10:
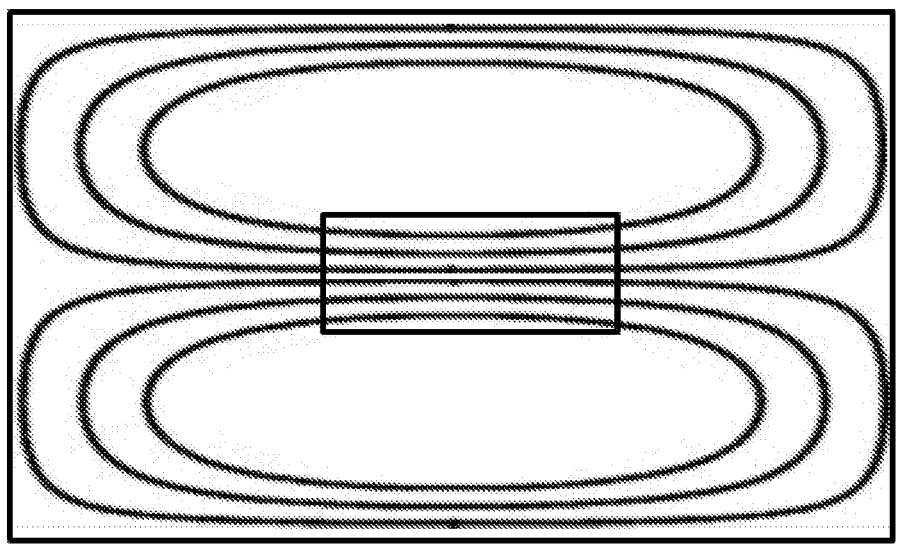
FIG. 10 schematically shows a cross section of the EPR resonator according to the invention having a sample in the center and with the magnetic field lines of the resonant microwave field of a TEM01n mode.

FIG. 10 shows a cross section of a cylindrical EPR resonator with a sample in the center and the magnetic field lines of the resonant microwave field.

Figure 11:
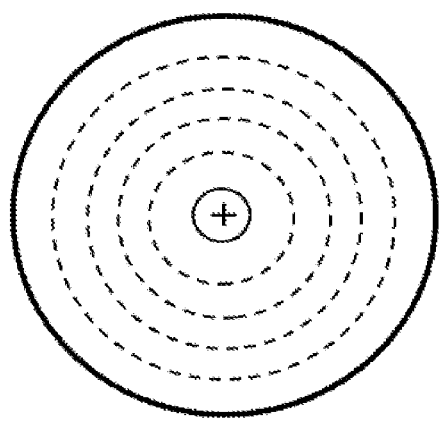
FIG. 11 schematically shows a cross section of the EPR resonator with the electrical field lines of the resonant microwave field.

FIG. 11 shows a cross section of the cylindrical EPR resonator of FIG. 10 with the electric field lines of the resonant microwave field. Electric and magnetic microwave fields are coexistent according to Maxwell equations. From FIG. 11 it can be seen that the spiral structure of the plungers—as proposed by the invention—reflect the symmetry of the electric microwave resonant mode. Any electrical contact between neighboring turns of the spiral winding would lead to a resonant structure that disturbs the confinement of the resonant microwave mode.

It should be noted that the plungers are not used for receiving or sending any electromagnetic signals.

FIG. 12 shows the characteristic curves of additional RF power absorption computed as relative to a constant amount of RF power delivered to the RF coils, effected by the EPR cavity for different extensions D of the filaments. Scaling limit convention is: 0% means air between RF coils (no resonator is present); upper limit can go above 100% (relative measurement) hence is not defined. At an extension D of about 2.5 mm the cutoff frequency for the external RF field is around 1 kHz. Smaller extensions D lead to a higher cutoff frequency, e.g. 20 kHz for 0.5 mm and 150 kHz for 10 µm.

Finally, FIG. 13 shows in a cut-open view the fully RF-transparent TE01n EPR resonator as composed of three parts: one wire wound solenoid (body 10) and two wire spiral wound plungers 11, 12 with openings 13, 18 placed inside the solenoid at its ends. Each plunger 11, 12 is made as a stack of independent spiral flat wire coils, without electrically conductive connection between neighboring layers. The inner bore of plungers 11, 12 provides access for inserting an EPR sample to the inner space of the EPR resonating cavity.

While only exemplary features of the invention have been illustrated and described herein, many modifications and changes will occur to those skilled in the art based on the disclosure provided here. It is, therefore, to be understood that the appended claims are intended to cover all such modifications and changes as fall within the full spirit and scope of the invention.

What is claimed is:

1. An electron paramagnetic resonance (EPR) resonator for a cylindrical TE01n microwave mode where n is an integer, comprising:
   a cylindrical body which has a radio frequency (RF) absorption of less than 5% at RFs below 1 kHz,
   a first plunger delimiting a resonating volume within the cylindrical body in an axial direction at a first end and
   a second plunger delimiting the resonating volume within the cylindrical body in the axial direction at a second end,
   wherein the second plunger has an opening configured to receive an EPR sample inserted into the EPR resonator,
   wherein the first and the second plunger each comprise at least one spiral winding of an electrically conductive filament, wherein neither ends nor neighboring turns of any of the spiral windings connect electrically conductively to form any electrically closed loop.

2. The EPR resonator according to claim 1, wherein the integer n is 1, 2, 3 or 4.

3. The EPR resonator according to claim 1, wherein a ratio D/δ of a minimum extension D of the filament to a distance δ between neighboring turns of the spiral winding is bigger than 1:1.

4. The EPR resonator according to claim 3, wherein the ratio D/δ is bigger than 10:1.

5. The EPR resonator according to claim 1, wherein a ratio of an axial length of at least one of the plungers to an inner bore diameter of the cylindrical body is at least equal to 1.

6. The EPR resonator according to claim 1, wherein the first plunger and/or the second plunger includes, in at least two layers, at least two spiral windings of the electrically conductive filament arranged in an axial direction of the cylindrical body without electrically conductive connection between neighboring ones of the layers.

7. The EPR resonator according to claim 6, wherein the first plunger and/or the second plunger include, in at least 30 layers, at least 30 spiral windings of the electrically conductive filament arranged in the axial direction without electrically conductive connection between the neighboring layers.

8. The EPR resonator according to claim 1, wherein the opening of the second plunger has a size smaller than a cut-off diameter of the cylindrical TE01n microwave mode.

9. The EPR resonator according to claim 1, wherein the first plunger has an opening for a support of a sample positioned in a working position in the EPR resonator.

10. The EPR resonator according to claim 1, wherein the first plunger or the second plunger has a second opening configured to transmit microwave radiation with an antenna.

11. The EPR resonator according to claim 3, wherein space between neighboring turns of the filament is filled with an insulator.

12. The EPR resonator according to claim 1, wherein the filament is coated with an insulator.

13. The EPR resonator according to claim 3, wherein the extension D of the filament is in a range of 5 μm to 5 mm.

14. The EPR resonator according to claim 13, wherein the extension D of the filament is in a range of 30 μm to 1 mm.

15. The EPR resonator according to claim 1, wherein the filament comprises a wire made entirely of metal.

16. The EPR resonator according to claim 1, wherein the metal wire is Ag or Au coated copper, brass or tungsten, or Ag or Au wire.

17. The EPR resonator according to claim 1, wherein an RF field is generated by RF coils arranged outside the EPR resonator and a lateral dimension of the RF coils relative to an axial length of the resonating volume within the cylindrical body is in a range of 50% to 200%.

18. The EPR resonator according to claim 17, wherein a homogeneity of the RF field at the sample volume is in a range of 0.01% to 10%.

19. The EPR resonator according to claim 18, wherein the homogeneity of the RF field at the sample volume is in a range of 0.1% to 1%.

* * * * *